(12) United States Patent
Costa et al.

(10) Patent No.: US 9,948,277 B2
(45) Date of Patent: *Apr. 17, 2018

(54) METHOD OF OPTIMIZING INPUT IMPEDANCE OF SURFACE ACOUSTIC WAVE FILTER

(71) Applicant: Resonant Inc., Santa Barbara, CA (US)

(72) Inventors: James R. Costa, Lompoc, CA (US); Balam Quitzé Andrés Willemsen Cortés, Lexington, MA (US)

(73) Assignee: Resonant Inc., Santa Barbara, CA (US)

( * ) Notice: Subject to any disclaimer, the term of this patent is extended or adjusted under 35 U.S.C. 154(b) by 76 days.

This patent is subject to a terminal disclaimer.

(21) Appl. No.: 15/159,672

(22) Filed: May 19, 2016

(65) Prior Publication Data

US 2017/0063336 A1     Mar. 2, 2017

Related U.S. Application Data

(63) Continuation-in-part of application No. 14/843,812, filed on Sep. 2, 2015, now Pat. No. 9,374,061.

(51) Int. Cl.
*H03H 9/64* (2006.01)
*G06F 17/50* (2006.01)

(52) U.S. Cl.
CPC ....... *H03H 9/6483* (2013.01); *G06F 17/5063* (2013.01); *G06F 17/5081* (2013.01); *H03H 2260/00* (2013.01)

(58) Field of Classification Search
CPC ............. G06F 17/5045; G06F 17/5081; G06F 17/5063; H03H 3/04; H03H 3/08; H03H 9/6483; H03H 9/725; H03H 2003/0414; H03H 2260/00; H03H 9/25

USPC .......................................... 333/133, 193–196
See application file for complete search history.

(56) References Cited

U.S. PATENT DOCUMENTS

| | | | |
|---|---|---|---|
| 6,870,441 B2 | 3/2005 | Veyres et al. | |
| 7,924,114 B2 | 4/2011 | Tsuzuki et al. | |
| 8,701,065 B1 | 4/2014 | Silver | |
| 8,751,993 B1 | 6/2014 | Fenzi et al. | |

(Continued)

FOREIGN PATENT DOCUMENTS

JP    2008-140210 A    6/2008

OTHER PUBLICATIONS

European Patent Office, Extended European Search Report for European Application No. 16180903.3, dated Feb. 3, 2017.

*Primary Examiner* — Robert J Pascal
*Assistant Examiner* — Jorge Salazar, Jr.
(74) *Attorney, Agent, or Firm* — SoCal IP Law Group LLP; John E. Gunther; Steven C. Sereboff

(57) ABSTRACT

Methods of designing band-pass filters are disclosed. A baseline filter design is established, the baseline filter design including a plurality of surface acoustic wave resonators having respective resonant frequencies, the surface acoustic wave resonators organized by resonant frequency into two or more groups. One or more alternative filter designs are established, each alternative filter design derived from the baseline filter design by reordering the resonant frequencies of two or more surface acoustic wave resonators within at least one of the two or more groups. A respective performance metric related to input impedance over a pass band is calculated for each of the baseline filter design and the alternative filter designs. A final filter design is selected from the baseline filter design and the alternative filter designs based on the respective performance metrics.

16 Claims, 8 Drawing Sheets

(56) References Cited

U.S. PATENT DOCUMENTS

| | | |
|---|---|---|
| 8,990,742 B2 | 3/2015 | Turner et al. |
| 9,038,005 B2 | 5/2015 | Turner et al. |
| 9,165,101 B2 | 10/2015 | Turner et al. |
| 9,208,274 B2 | 12/2015 | Turner et al. |
| 9,325,294 B2 | 4/2016 | Silver et al. |
| 9,331,669 B2 | 5/2016 | Costa et al. |
| 9,369,111 B1 | 6/2016 | McHugh et al. |
| 9,374,061 B1 | 6/2016 | Costa et al. |
| 9,391,351 B2 | 7/2016 | Raihn et al. |
| 9,524,360 B2 | 12/2016 | Turner et al. |
| 9,525,393 B1 | 12/2016 | Raihn et al. |
| 9,608,595 B1 | 3/2017 | Raihn et al. |
| 9,654,078 B1 | 5/2017 | Raihn et al. |
| 2009/0273408 A1 | 11/2009 | Inoue et al. |
| 2015/0179406 A1 | 6/2015 | Johnson et al. |
| 2015/0214923 A1 | 7/2015 | Tsuzuki |
| 2015/0220665 A1 | 8/2015 | Turner et al. |
| 2017/0083649 A1 | 3/2017 | Yang et al. |

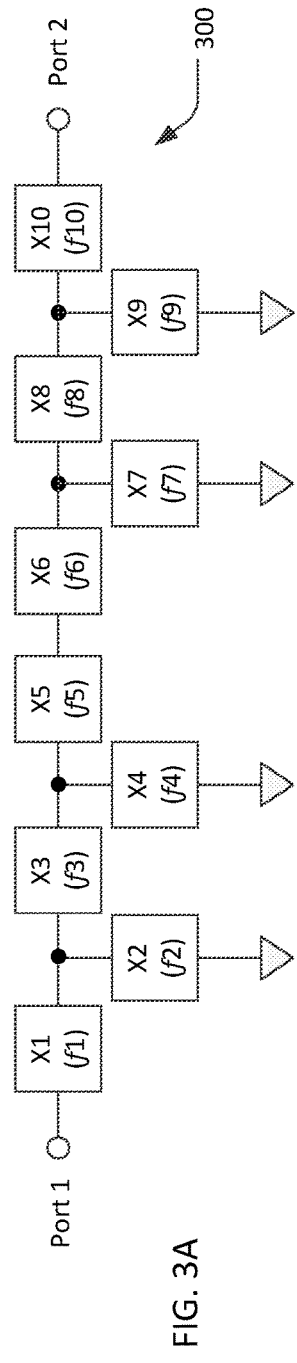
FIG. 3A
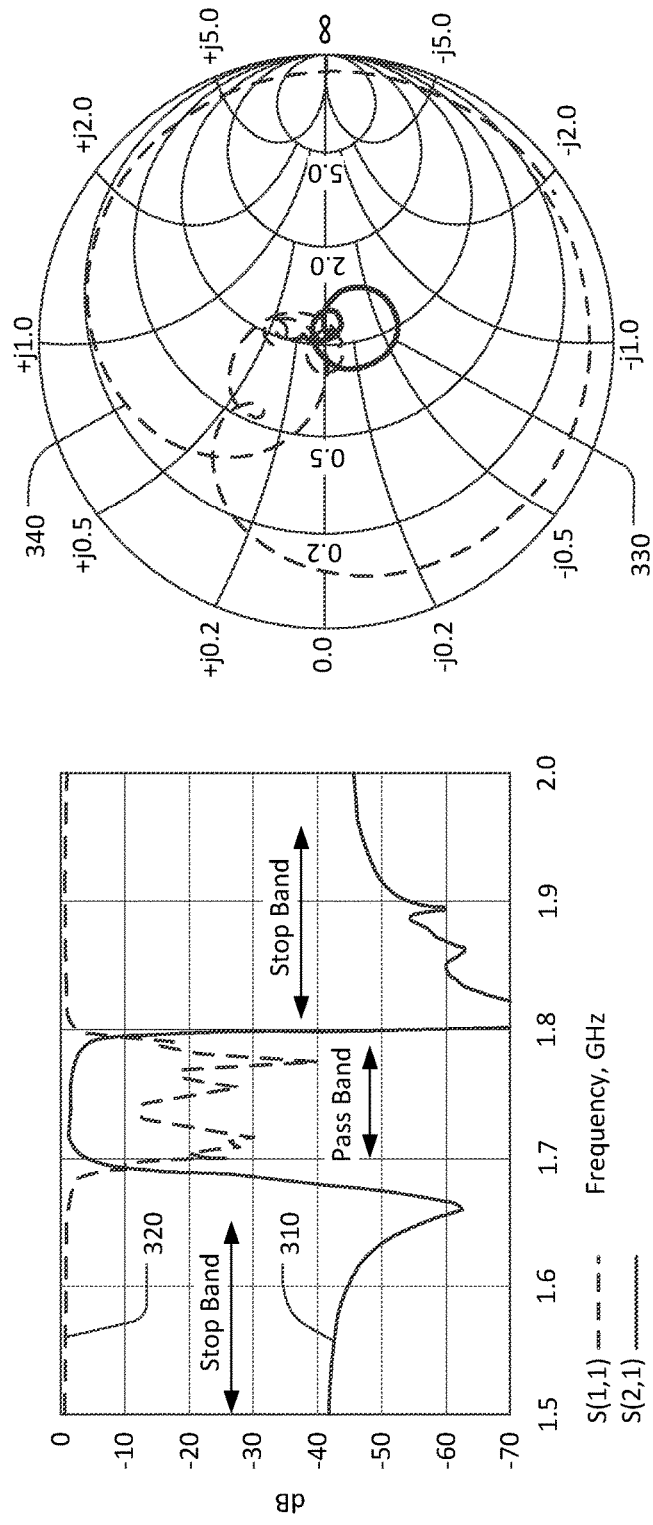
FIG. 3B
FIG. 3C

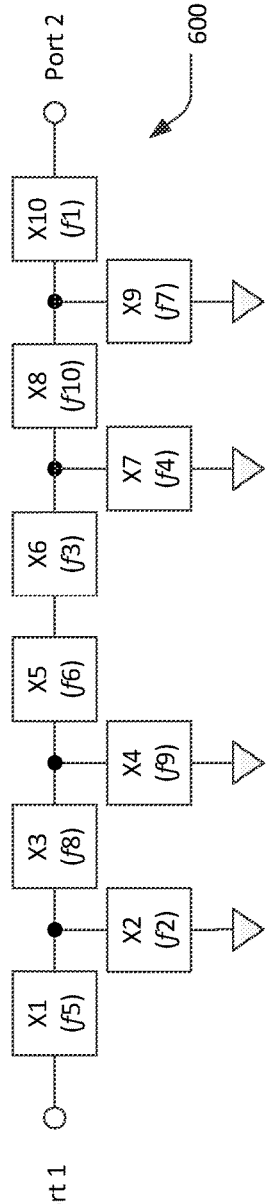
FIG. 6A
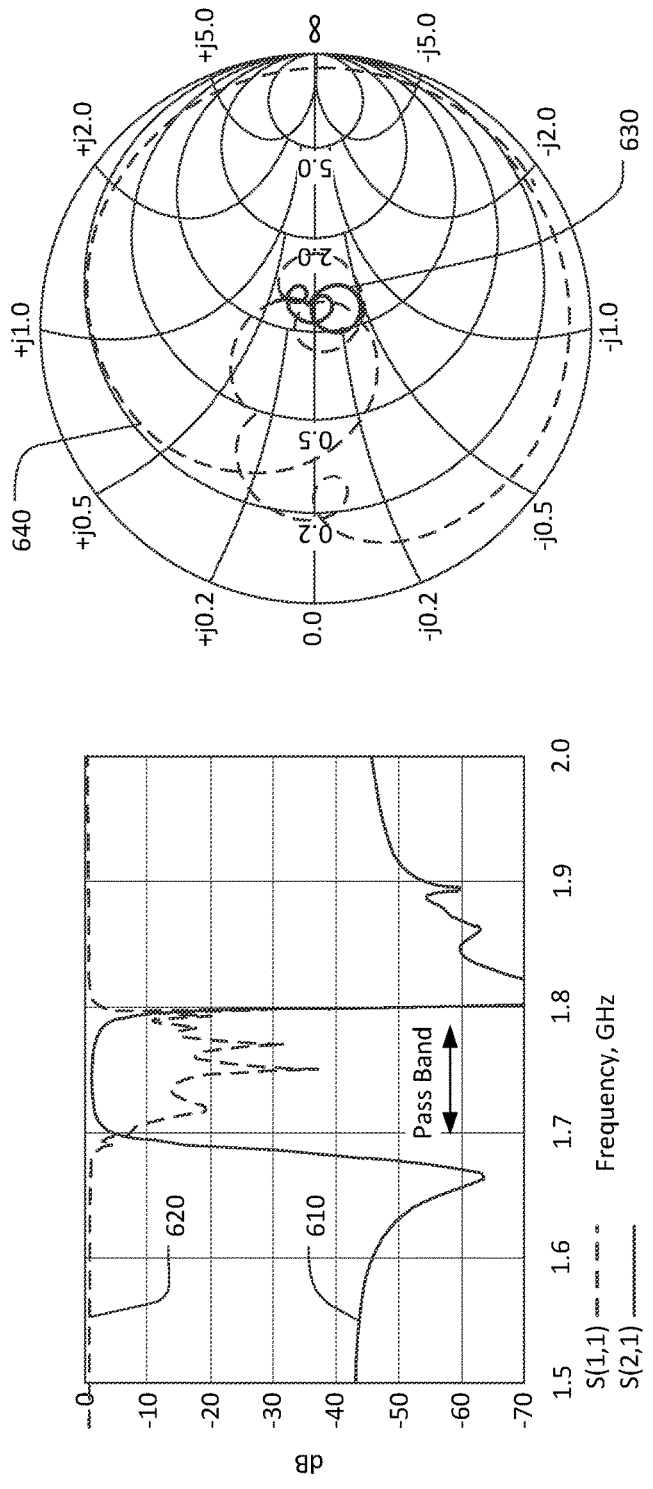
FIG. 6C
FIG. 6B

METHOD OF OPTIMIZING INPUT IMPEDANCE OF SURFACE ACOUSTIC WAVE FILTER

RELATED APPLICATION INFORMATION

This patent is a continuation-in-part of prior-filed non-provisional patent application Ser. No. 14/843,812, titled METHOD OF OPTIMIZING INPUT IMPEDANCE OF SURFACE ACOUSTIC WAVE FILTER, filed Sep. 2, 2015, now U.S. Pat. No. 9,374,061 B1.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using surface acoustic wave (SAW) resonators, and specifically to transmit filters and duplexers for use in communications equipment.

Description of the Related Art

As shown in FIG. 1, a SAW resonator 100 may be formed by thin film conductor patterns formed on a surface of a substrate 105 made of a piezoelectric material such as quartz, lithium niobate, lithium tantalate, or lanthanum gallium silicate. The substrate 105 may be a single-crystal slab of the piezoelectric material, or may be a composite substrate including a thin single-crystal wafer of the piezoelectric material bonded to another material such as silicon, sapphire, or quartz. A composite substrate may be used to provide a thermal expansion coefficient different from the thermal expansion coefficient of the single-crystal piezoelectric material alone. A first inter-digital transducer (IDT) 110 may include a plurality of parallel conductors. A radio frequency or microwave signal applied to the first IDT 110 via an input terminal IN may generate an acoustic wave on the surface of the substrate 105. As shown in FIG. 1, the surface acoustic wave will propagate in the left-right direction. A second IDT 120 may convert the acoustic wave back into a radio frequency or microwave signal at an output terminal OUT. The conductors of the second IDT 120 may be interleaved with the conductors of the first IDT 110 as shown. In other SAW resonator configurations (not shown), the conductors forming the second IDT may be disposed on the surface of the substrate 105 adjacent to, or separated from, the conductors forming the first IDT.

The electrical coupling between the first IDT 110 and the second IDT 120 is highly frequency-dependent. The electrical coupling between the first IDT 110 and the second IDT 120 typically exhibits both a resonance (where the impedance between the first and second IDTs is minimum) and an anti-resonance (where the impedance between the first and second IDTs is maximum). The frequencies of the resonance and the anti-resonance are determined primarily by the pitch and orientation of the interdigitated conductors, the choice of substrate material, and the crystallographic orientation of the substrate material. Grating reflectors 130, 132 may be disposed on the substrate to confine most of the energy of the acoustic waves to the area of the substrate occupied by the first and second IDTs 110, 120.

SAW resonators are used in a variety of radio frequency filters including band reject filters, band pass filters, and duplexers. A duplexer is a radio frequency filter device that allows simultaneous transmission in a first frequency band and reception in a second frequency band (different from the first frequency band) using a common antenna. Duplexers are commonly found in radio communications equipment including cellular telephones.

FIG. 2 is a block diagram of portions of a communications device 200. The communications device 200 includes a transmitter 210, a duplexer 220, and antenna 230, and a receiver 240. The duplexer 220 may include a transmit filter 222 and a receive filter 224. The transmit filter 222 may be coupled between the transmitter 210 and the antenna 230. The receive filter 224 may be coupled between the antenna 230 and a receiver 240. An important function of the duplexer 220 is to isolate the receiver from the transmitter to ensure the receiver is not overloaded by energy from the transmitter. To this end, the transmit filter 222 may be designed to pass frequencies in a transmit frequency band and block, or reject, frequencies in a receive frequency band separate for the transmit frequency band. Conversely, the receive filter may be designed to pass frequencies in the receive frequency band and block frequencies in the transmit frequency band.

The transmitter 210 may include a power amplifier 212 that generates the radio frequency signal to be transmitted and an impedance matching network 214 to couple the radio frequency signal from the power amplifier 212 and the transmit filter 222 within the duplexer 220. The impedance matching network 214 may be design to match the output impedance of the power amplifier 212 to the input impedance of the transmit filter 222. Although shown as a portion of the transmitter 210, the impedance matching network 214 may incorporated, in whole or in part, in the transmit filter 222. The output impedance of the power amplifier 212 is typically constant, or nearly constant, over the transmit frequency band. To ensure efficient coupling of power from the power amplifier 212 to the antenna 230, it may be preferable for the input impedance of the transmit filter 222 to also be constant, to the extent possible, over the transmit frequency band.

DESCRIPTION OF THE DRAWINGS

FIG. 3A is block diagram of an exemplary surface acoustic wave filter transmit filter.

FIG. 3B is a graph of S-parameters of the filter of FIG. 3A.

FIG. 3C is a Smith chart with a plot of the input impedance of the filter of FIG. 3A.

FIG. 6A is block diagram of another exemplary surface acoustic wave filter transmit filter.

FIG. 6B is a graph of S-parameters of the filter of FIG. 5A.

FIG. 6C is a Smith chart with a plot of the input impedance of the filter of FIG. 5A.

Throughout this description, elements appearing in figures are assigned three-digit reference designators, where the most significant digit is the figure number where the element is first shown and the two least significant digits are specific to the element. An element that is not described in conjunction with a figure may be presumed to have the same characteristics and function as a previously-described element having the same reference designator.

DETAILED DESCRIPTION

Description of Apparatus

Filter circuits commonly incorporate more than one SAW resonator. For example, FIG. 3A shows a schematic diagram of an exemplary band-pass filter circuit 300 incorporating ten SAW resonators, labeled X1 through X10. The filter circuit 300 includes six series resonators (X1, X3, X5, X6, X8, and X10) connected in series between an input (Port 1) and an output (Port 2). The filter circuit 300 includes four shunt resonators (X2, X4, X7, and X9) connected between junctions of adjacent series resonators and ground. The use of ten SAW resonators, six series resonators, and four shunt resonators is exemplary. A filter circuit may include more or fewer than ten SAW resonators and a different arrangement of series and shut resonators. The filter circuit 300 may be, for example, a transmit filter for incorporation into a duplexer, such as the duplexer 220.

Figure 1:
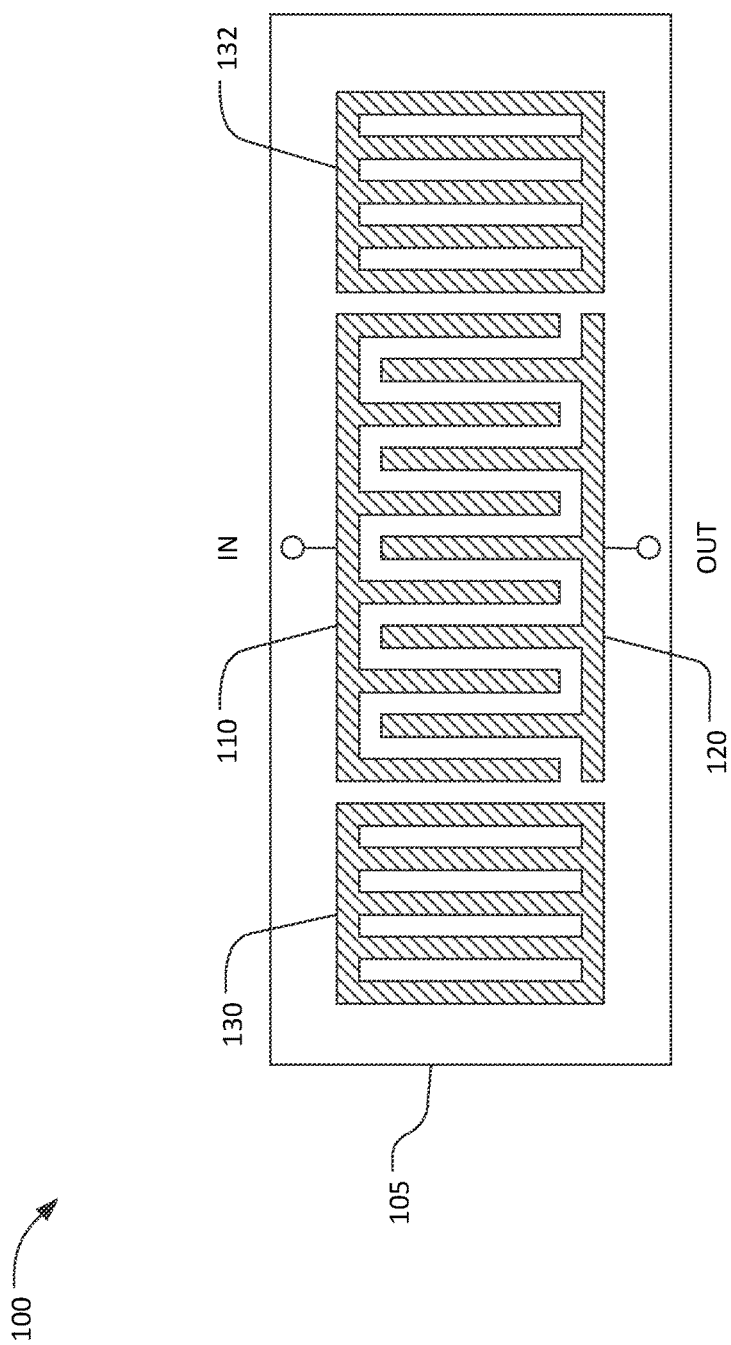
FIG. 1 is a schematic plan view of a SAW resonator.
Figure 2:
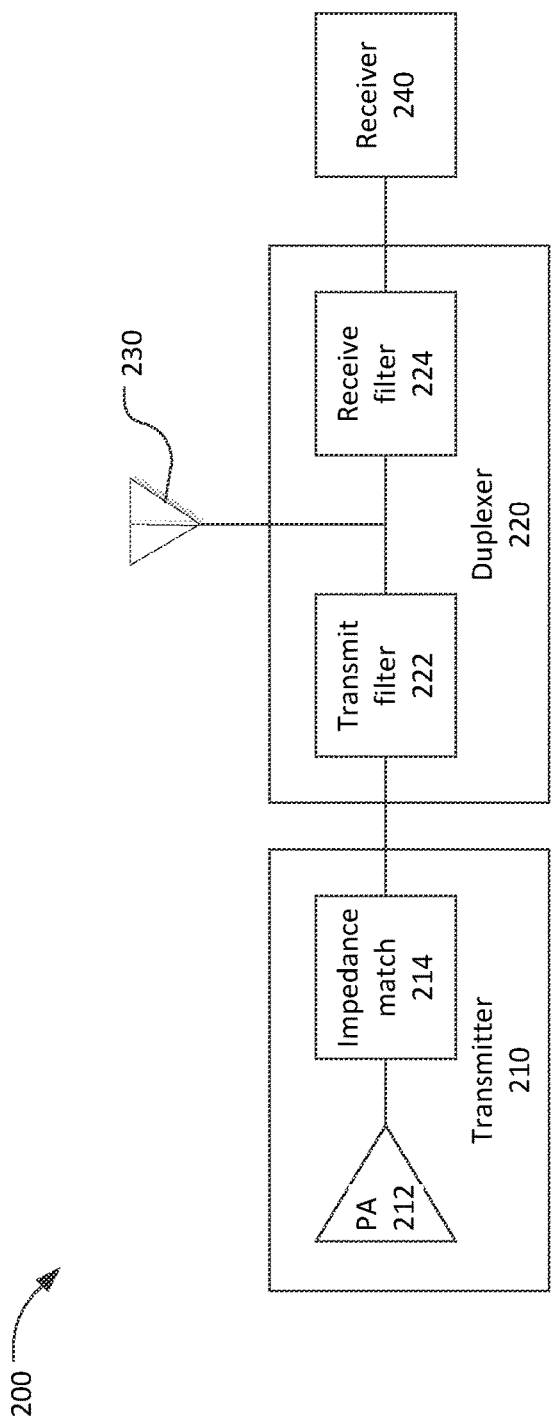
FIG. 2 is a block diagram of a communications device.

Each of the ten resonators X1-X10 may be comprised of inter-digital transducers and grating reflectors as shown in FIG. 1. Each of the ten resonators X1-X10 may have a corresponding resonant frequency, f1-f10. The resonant frequencies f1-f10 may all be different. The resonant frequencies of some of the resonators X1-X10 may be the same. Typically, the resonant frequencies f2, f4, f7, f9 of the shut resonators may be offset from the resonant frequencies f1, f3, f5, f6, f8, f10 of the series resonators.

FIG. 3B is a graph plotting selected S-parameters, or scattering parameters, of the filter 300. S-parameters are a convention used to describe the performance of linear electrical networks. The solid line 310 is a plot of S(2,1), which is the transfer function from port 1 to port 2 of an electrical network. S(2,1) is essentially the "insertion loss" of the filter with a change in numeric sign (e.g. S(2,1)=−3 dB is equivalent to an insertion loss of 3 dB). In this case, the solid line 310 plots the input-to-output transfer function of the filter 300. A band-pass filter may be required to transfer a signal input at Port 1 of the filter 300 to Port 2 with little loss for frequencies within a predetermined "pass band". As shown in FIG. 3B, the pass band of the filter 300 is about 1.7 GHz to 1.79 GHz. Frequencies displaced from the pass band are substantially attenuated. The specifications on a band pass filter may include a minimum value of S(2,1) (i.e. a maximum insertion loss) over the pass band and a maximum value of S(2,1) (i.e. a minimum insertion loss) for each of one or more stop bands.

The dashed line 320 is a plot of S(1,1), which is the transfer function from port 1 to port 1 of an electrical network. In this case, the dashed line 320 plots the input-to-input reflection coefficient the filter 300 with all other ports terminated with the ideal load impedance, often denoted by the Greek letter gamma (Γ). A signal input at Port 1 of the filter 300 is substantially reflected back to Port 1 for frequencies outside of the pass band. For frequencies within the −pass band, the reflection of the input signal varies between −10 dB and −40 dB.

FIG. 3C shows an impedance Smith chart. A Smith chart is a plot, using polar coordinates, of the complex reflection coefficient of a circuit. FIG. 3C is a plot of the complex reflection coefficient of Port 1 of the filter 300. The center point represents a reflection coefficient of zero, and the perimeter of the chart represents a reflection coefficient of one.

The reflection coefficient of a circuit is determined by the input impedance of the circuit and the impedance of the source driving the circuit. Thus a Smith chart can be used as a graphical aid for visualizing the input impedance of a circuit, for example, as a function of frequency. When used to visualize input impedance, real and complex impedance scales are added to a conventional Smith chart to provide what is commonly called an "impedance Smith chart" as shown in FIG. 3C. The center point of the Smith chart (reflection coefficient equal to zero) represents an input impedance equal to the source impedance. The source impedance is commonly, but not necessarily, 50 ohms. The horizontal line through the center point is the locus of real impedance values (i.e. resistors). The circumference of the chart is the locus impedance values that result in 100% reflection. The left end of the horizontal line through the center point of the Smith chart represents a short circuit (0 impedance) and the right end of this line represents an open circuit (infinite impedance). Any complex input impedance value will correspond to a unique point on a Smith chart.

The input impedance of the filter 300 over the frequency range from 1.5 GHz to 2.0 GHz is plotted on the impedance Smith chart of FIG. 3C. The solid line 330 shows the input impedance over the pass band of the filter 300, and the dashed line 340 shows the input impedance for frequencies outside of the pass band. Ideally, the input impedance of the filter 300 will be constant over the pass band, in which case a graph of the input impedance over the pass band would be a single point on the impedance Smith chart. However, this ideal cannot be achieved in a real band pass filter. A realistic design objective is for the input impedance of the filter 300 to vary by no more than a predetermined amount over the pass band. For example, the design objective or requirement may be for the two most widely separated points on the solid curve 330 to be separated by no more than a predetermined distance. Equivalently, the design objective or requirement may be for solid curve 330 to be fully contained with a circle having a predetermined diameter.

Figure 4:
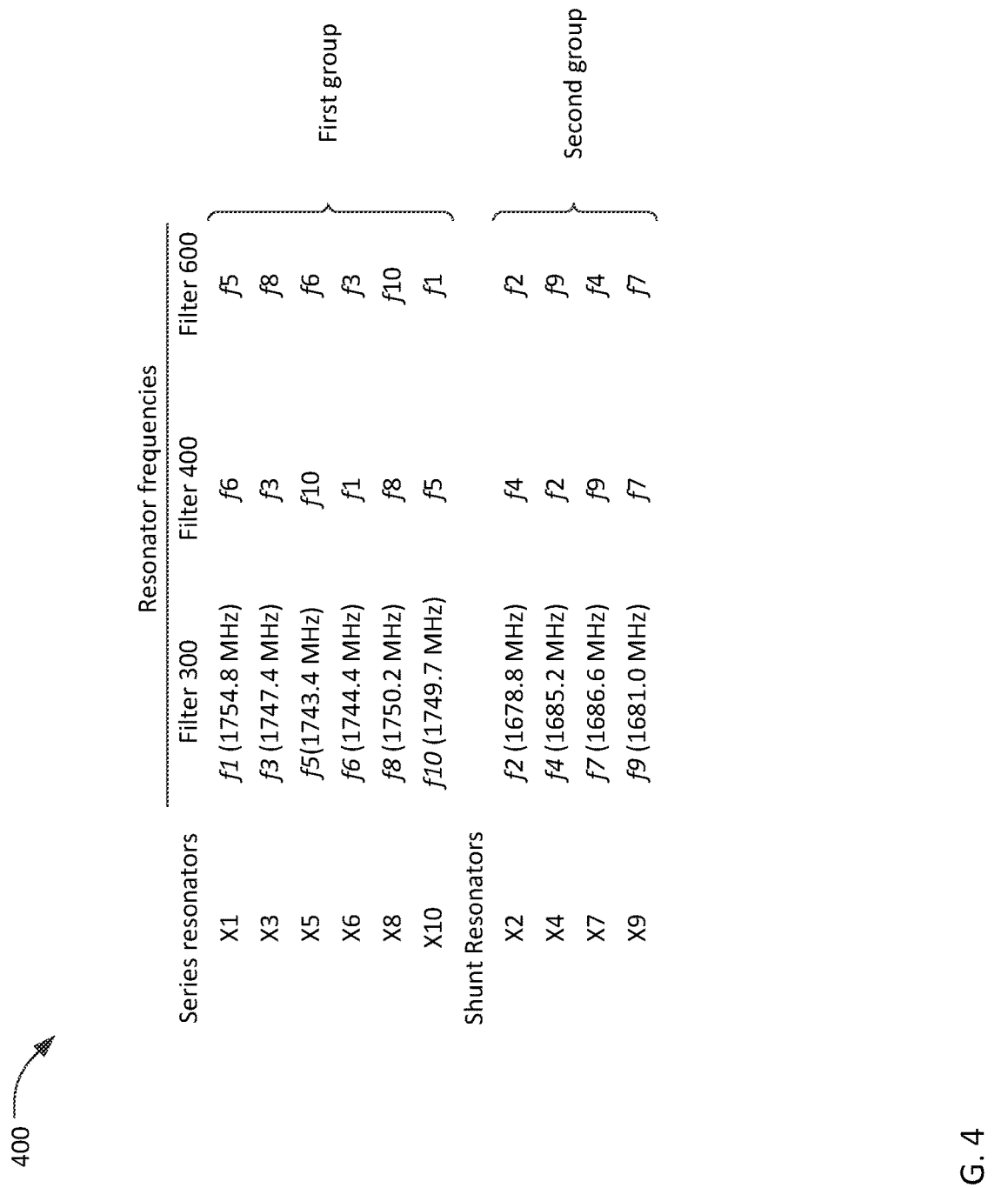
FIG. 4 is a table comparing resonator frequencies of the exemplary surface acoustic wave filters of FIG. 3A, FIG. 5A, and FIG. 6A.

FIG. 4 is table 400 listing the resonant frequencies of the resonators in the filter 300 and filters 500 and 600 which will be discussed subsequently. The filters 500 and 600 are derived from the filter 300 by reordering the resonant frequencies of at least some of the resonators. The reordering of the resonant frequencies can be understood from the table 400. For example, in the filter 500, resonator X1 has resonant frequency f6, which was the resonant frequency of resonator X6 in the filter 300. Of the ten SAW resonators in the filter 500, only resonator X8 has the same resonant frequency as its counterpart in the filter 300. Except for resonant frequency, the layout (i.e. relative position on the substrate), size, and other attributes of the ten SAW resonators in the filter 500 may be the same as the respective counterpart resonators in the filter 300.

The resonators within filters may be organized into groups by resonant frequency, which is to say resonators having similar resonant frequencies way be organized into groups. The resonators in the filters 300, 500, and 600 can be organized into two groups. The first group includes resonators X1, X3, X5, X6, X8, and X10 with resonant frequencies between 1743.4 MHz to 1754.8 MHz. The first group has an average frequency of 1748.3 MHz and a frequency span (difference between the highest and lowest resonant frequencies in the group) of 11.4 MHz. The first group may be defined as "resonators having resonant frequencies within the pass band" (as shown in FIG. 3B). The second group includes resonators X2, X4, X7, and X9 with resonant frequencies from 1678.8 MHz to 1686.6 MHz. The second group has an average frequency of 1682.9 MHz and a frequency span of 7.8 MHz. The second group may be defined as "resonators having resonant frequencies below the pass band".

In the exemplary filters 300, 500, and 600, the first group includes all of the series resonators and the second group includes all of the shunt resonators in the filter circuits. This is not necessarily the case for all filter circuits. Other filter circuits may include more than two groups of resonators. Some filters may include, for example, a third group of series and/or shunt resonators having resonant frequencies above the pass band. For further example, dual-band filters may have four or more groups of resonators, each centered at a different frequency.

Generally, the frequency spans of each of two groups of resonators will both be less than or equal to one-half of the frequency difference between the average frequencies of the two groups. In the exemplary filters 300, 500, and 600, the first group has a frequency span of 6.8 MHz, the second group has a frequency span of 7.8 MHz, and the frequency difference between the average frequencies of the two groups is 65.4 MHz. In a band-pass filter, the frequency difference between the average frequencies of two groups may be greater than or equal to one-half of the width of the filter's pass band. In the exemplary filters 300, 500, and 600, the pass band width is about 90 MHz and the frequency difference between the average frequencies of the two groups is 65.4 MHz which is greater than one-half of the passband width.

As can be seen in FIG. 4, the filters 500 and 600 are derived from the filter 300 by reordering only the resonant frequencies of resonators within the same group. Such reordering is "permitted" because it not does have a substantial effect on the width or frequency of the passband of a bad-pass filter. Permitted reordering can be used to optimize filter performance, and in particular filter input impedance, while maintaining the same general filter transmission. Exchanging resonator frequencies between groups is not permitted since such exchanges can have a substantial detrimental effect on the filter characteristics.

Figure 5A:
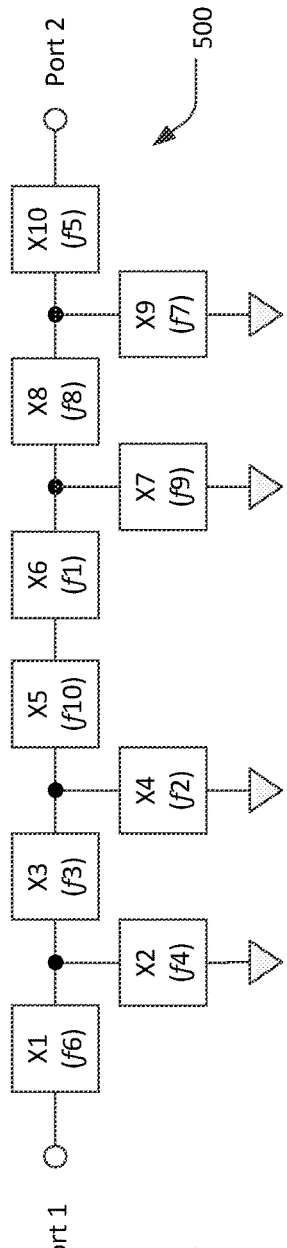
FIG. 5A is block diagram of another exemplary surface acoustic wave filter transmit filter.

FIG. 5A shows a schematic diagram of the band-pass filter circuit 500 that, like the band-pass filter circuit 300, includes six series SAW resonators (X1, X3, X5, X6, X8, and X10) connected in series between an input (Port 1) and an output (Port 2), and four shunt resonators (X2, X4, X7, and X9) connected between junctions of adjacent series resonators and ground. The filter circuit 500 is derived from the filter circuit 300 by exchanging resonant frequencies between the resonators in the first group (i.e. the six series resonators) and exchanging resonant frequencies between the resonators in the second group (i.e. the four shunt resonators).

Figure 5C:
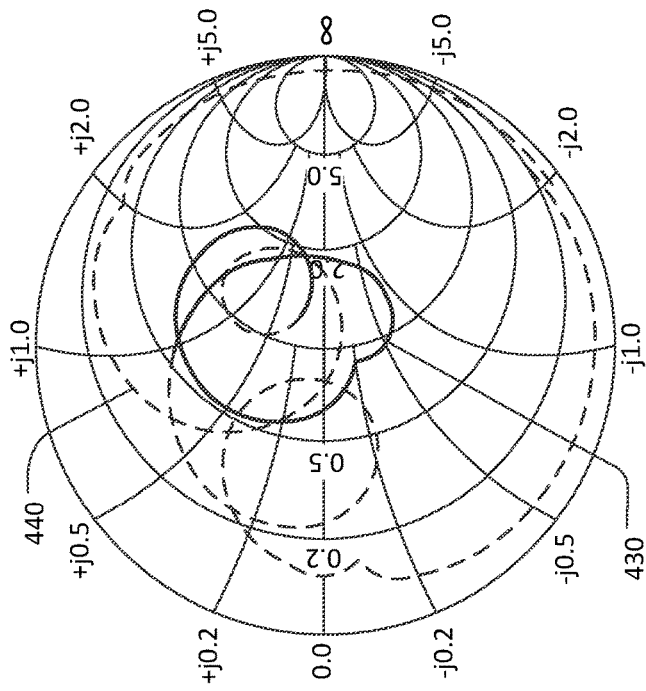
FIG. 5C is a Smith chart with a plot of the input impedance of the filter of FIG. 5A.
Figure 5B:
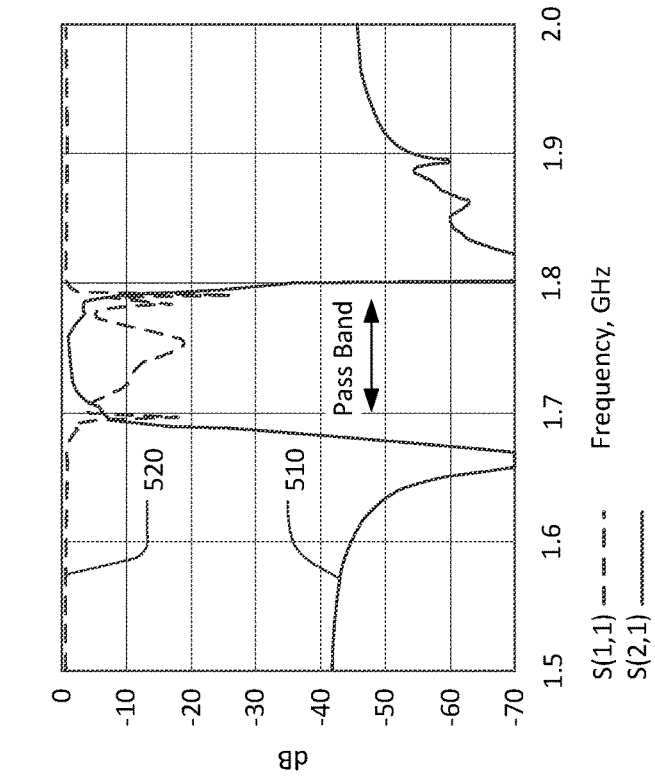
FIG. 5B is a graph of S-parameters of the filter of FIG. 5A.

FIG. 5B is a graph plotting selected s-parameters of the filter 500. The solid line 510 is a plot of S(2,1), which is the input-to-output transfer function of the filter 500. The pass band of the filter 500 about 1.7 GHz to 1.79 GHz, the same as that of the filter 300. A signal input at Port 1 of the filter 500 is transferred to Port 2 with relatively little loss for frequencies within the pass band. However, the loss of the filter 500 within the pass band may be as high as 5 dB, which is significantly greater that the loss of the filter 300 over the pass band. Frequencies displaced from the pass band are substantially attenuated.

The dashed line 520 is a plot of S(1,1), which is the input-to-input reflection coefficient of the filter 500. A signal input at Port 1 of the filter 500 is substantially reflected back to Port 1 for frequencies outside of the pass band. For frequencies within the pass band, the reflection of the input signal varies between −5 dB and −25 dB. Thus the reflection coefficient of the filter 500 in the pass band is significantly higher than that of the filter 300.

FIG. 5C is a graph of the input impedance of the filter 500 over the frequency range from 1.5 GHz to 2.0 GHz plotted on impedance Smith chart. The solid line 530 shows the input impedance over the pass band of the filter 500, and the dashed line 540 shows the input impedance for frequencies outside of the pass band. The input impedance of the filter 500 over the pass band (solid line 530) varies substantially. The mismatch between the input impedance of the filter 500 and the source impedance of the signal introduced at Port 1 of the filter is the root cause of the high reflection coefficient and degraded transmission of the filter 500.

FIG. 6A shows a schematic diagram of the exemplary band-pass filter circuit 600 that, like the band-pass filter circuits 300 and 500, includes six series SAW resonators (X1, X3, X5, X6, X8, and X10) connected in series between an input (Port 1) and an output (Port 2), and four shunt resonators (X2, X4, X7, and X9) connected between junctions of adjacent series resonators and ground. The filter circuit 600 is also derived from the filter circuit 300 by exchanging resonant frequencies between the resonators in the first group (i.e. the six series resonators) and exchanging resonant frequencies between the resonators in the second group (i.e. the four shunt resonators). The manner in which the resonant frequencies have been exchanged can be understood from table 400 in FIG. 4. For example, in the filter 600, resonator X1 has resonant frequency f5, which was the resonant frequency of resonator X5 in the filter 300. The resonance frequency of resonator X1 in the filter 300 f1 is the resonant frequency of resonator X10 in filter 600 and so on. Of the ten SAW resonators in the filter 600, only resonator X2 has the same resonant frequency as its counterpart in the filter 300. Except for resonant frequency, the layout (i.e. relative position on the substrate), size, and other attributes of the ten SAW resonators in the filter 600 may be the same as the respective counterpart resonators in the filter 300.

FIG. 6B is a graph plotting selected s-parameters, or scattering parameters, of the filter 600. The solid line 610 is a plot of S(2,1), which is the input-to-output transfer function of the filter 600. The pass band of the filter 600 about 1.7 GHz to 1.79 GHz, the same as that of the filter 300. A signal input at Port 1 of the filter 600 is transferred to Port 2 with little loss for frequencies within the pass band. Frequencies displaced from the pass band are substantially attenuated.

The dashed line 620 is a plot of S(1,1), which is the input-to-input reflection coefficient of the filter 600. A signal input at Port 1 of the filter 600 is substantially reflected back to Port 1 for frequencies outside of the pass band. For frequencies within the –pass band, the reflection of the input signal varies between –16 dB and –42 dB. Thus the reflection coefficient of the filter 600 in the pass band is significantly lower than that of the filter 300.

FIG. 6C is a graph of the input impedance of the filter 400 over the frequency range from 1.5 GHz to 2.0 GHz plotted on an impedance Smith chart. The solid line 630 shows the input impedance over the pass band of the filter 600, and the dashed line 640 shows the input impedance for frequencies outside of the pass band. The input impedance of the filter 600 over the pass band (solid line 630) varies less than the input impedance of the filter 300 over the pass band. The small variation of the input impedance of the filter 600 over the pass band allows a better impedance match with the source impedance of the signal introduced at Port 1 of the filter, resulting in the lower reflection coefficient of the filter 600.

Description of Processes

Comparison of FIG. 3C, FIG. 5C, and FIG. 6C shows that the ordering of the resonator resonant frequencies in a SAW band-pass filter has a substantial effect on the input impedance, transmission, and reflection of the filter over the pass band, while having little effect on the center frequency and bandwidth of the pass band or the performance of the filter for frequencies outside of the pass band. Thus changing the order of the resonator resonant frequencies provides a means of optimizing SAW band-pass filter input impedance relatively independently of other filter characteristics.

Figure 7:
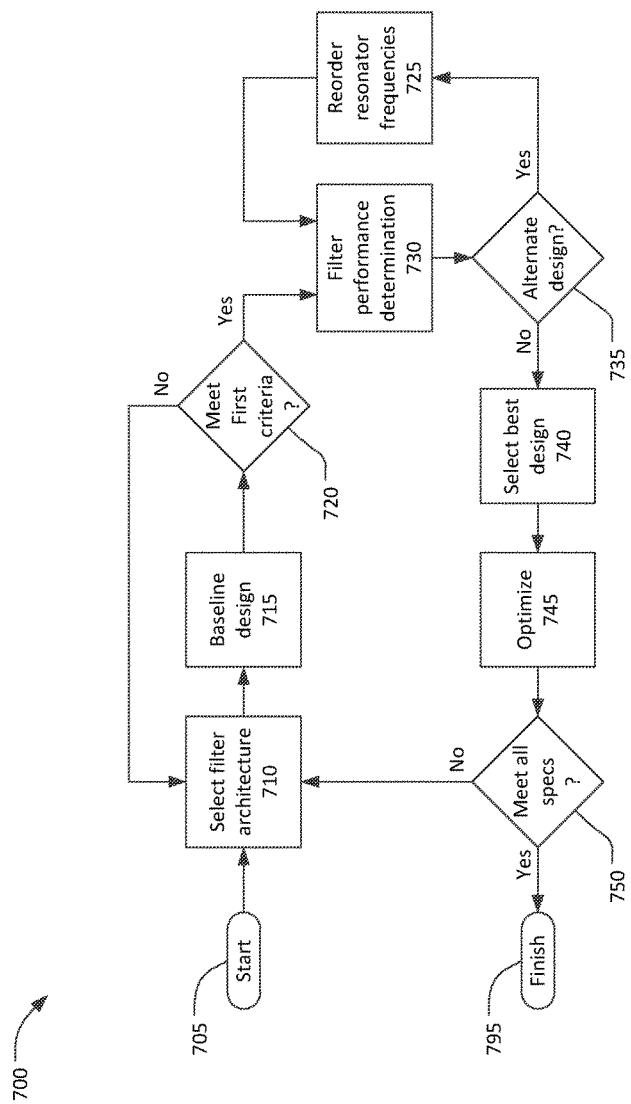
FIG. 7 is a flow chart of a method for optimizing the input impedance of a surface acoustic wave filter.

FIG. 7 is a flow chart of a process 700 for designing a SAW band-pass filter. The process 700 starts at 705 with a set of specifications for the filter. The set of specifications may include, for example, specifications on the lower and upper frequencies of a pass band and, optionally, one or more stop bands. The set of specifications may include a minimum value of S(2,1) (i.e. a maximum insertion loss) over the pass band and maximum values of S(2,1) (i.e. minimum insertion losses) over each stop band, if defined. The set of specifications may include an input impedance range. The input impedance range may be defined, for example, as a maximum reflection coefficient or a maximum voltage standing wave ratio (VSWR) at the input of the filter when driven by a source with a predetermined source impedance. The input impedance range may be defined in some other manner. The set of specifications for the filter may include other requirements such as a maximum die size, an operating temperature range, an input power level, and other requirements.

At 710 the architecture of the filter may be selected. Specifically, a substrate configuration (single-crystal or composite), a particular piezoelectric material and crystalline orientation (i.e. the angle of the surface of a substrate to the internal crystalline axis), and the number, type, and arrangement of SAW resonators may be selected. For example, the band-pass filters of FIGS. 3A, 5A, and 6A have six series resonators and four shunt resonators. Other filter architectures may include more or fewer series and/or shunt SAW resonators, the same number of SAW resonators connected differently (for example having a shunt resonator connected from the input and/or output port to ground). In addition to the number and arrangement of SAW resonators, a substrate type (which determines, in part, the frequency spacing between the resonance and anti-resonance of each SAW resonator) may be selected at 710. Other characteristics of the filter that may be selected at 710 include the type and thickness of the metal used to form the interdigitated transducers of the SAW resonators, the presence or absence and material of a dielectric coating over the interdigitated transducers, and other manufacturing-related characteristics.

At 720, a baseline filter design using the architecture selected at 710 may be established. The baseline design may be performed, for example, by a design engineer using a circuit design software tool and/or an electromagnetic (EM) analysis tool. When a circuit design tool is used, the filter may be analyzed as an electronic circuit, with the SAW resonators represented by combinations of lumped capacitor, inductor, and resistor elements. When an EM analysis tool is used, the filter may be represented by models of the SAW resonator IDTs on the substrate. Either or both of circuit design tool and the EM analysis tool may be capable of automated optimization of the filter design to satisfy, to the extent possible, predetermined first design criteria. The first design criteria may be a subset of the set of filter specifications from 705. For example, the first design criteria may include the lower and upper frequencies of a pass band and, optionally, one or more stop bands. The first design criteria may also include a minimum value of S(2,1) over the pass band and maximum values of S(2,1) over each stop band, if defined. The first design criteria may include other filter specifications.

Note that the architecture selected at 710 may not necessarily be capable of satisfying the first design criteria. For example, if the first design criteria for a band-pass filter include a narrow pass band and high stop-band rejection, the criteria may not be satisfied with an architecture having only a few SAW resonators. At 730, a determination may be made if the baseline design from 720 meets the first design criteria. If the baseline design, optimized to the extent possible using the available software tools, does not meet the first design criteria ("No" at 730) the process 700 may return to 710 to select a different filter architecture.

The actions from 710 to 730 may be repeated as necessary until a baseline design meeting the first design criteria is established. Since each SAW resonator occupies a finite substrate area, a filter with fewer resonators will, in general, use a smaller substrate and cost less to manufacture than a filter with more resonators. Thus a possible sequence of actions may to initially select, at 710, a filter architecture with marginally few resonators, and then add or more resonators to the architecture each time the actions from 710 to 730 are repeated.

When a determination is made at 720 that the baseline design meets the first design criteria ("yes" at 720), further optimization of the filter design may be undertaken with the objective of improving the uniformity of the input impedance over the pass band. At 730, a performance metric may be derived by analysis of the baseline filter design. The performance metric may include one or more parameters relating to the input impedance of the baseline filter over the pass band. Various performance metrics will be discussed subsequently with respect to FIG. 8. At 735, a determination may be made whether or not to seek an alternate design. When only the baseline filter design has been evaluated, the determination at 735 will always be "yes" such that at least one alternative design is established and evaluated.

At 725, an alternate filter design may be established by reordering the frequencies of the resonators within the previous filter design. Reordering the frequencies of resonators within the same group is permitted. Reordering the frequencies of resonators within two or more groups is permitted so long as each resonator remains within the same group. Exchanging resonators or resonant frequencies between groups is not permitted. Interchanging the resonant frequencies of the two or more resonators may be accomplished by changing the pitch of the IDTs in the appropriate resonators while leaving other characteristics (e.g. the relative positions of the resonators on the substrate, the physical size of each resonator, the conductors interconnecting the resonators, and other characteristics) unchanged.

The performance of the alternate filter design with reordered resonant frequencies may be analyzed at 730 to develop a respective performance metric. A determination may then again be made at 735 whether or not to try another alternate filter design with a different order of the resonator frequencies. When a determination is made to try another alternative filter design, the process 700 may return to 725. The actions from 725 to 735 may be repeated until a determination is made at 735 that another try is not required.

The number of possible alternate filter designs is equal to the number of possible orders for the resonator resonant frequencies that can be selected at 725. Assuming only two groups of resonators, the number of possible alternate filter designs is given by N!M!, where N is the number of resonators in the first group and M is the number of resonators in the second group. In the example of FIGS. 3A, 5A, and 6A, the number of possibilities is 6!4!=(720)(24) =17280. Various strategies may be used to determine how the resonant frequencies should be reordered each time the action at 725 is repeated. For example, a software program may be developed that sequentially selects and analyzes each of the permitted reordering of the resonator frequencies.

To reduce the amount of computation required (compared to analyzing every possible order for the resonance frequencies), an iterative strategy, such as a variation on a hill-climbing algorithm, may be used to reorder the resonance frequencies of the resonators. For example, at 725, the resonance frequencies of a pair of resonators within the same group may be interchanged and the resulting alternate filter may be analyzed at 730. If a new alternate filter with the interchanged resonant frequencies is an improvement, based on the filter performance metric, over the prior filter, the new alternate filter becomes the new baseline design. If the new alternate filter with the interchanged resonant frequencies is not an improvement over the prior filter, the change is reversed. In either case, the steps of selecting a new pair of resonators, interchanging the resonance frequencies of the selected resonators, analyzing the result, and determining whether or not to keep the change are repeated. Thus the filter performance may be incrementally improved over some number of iterations. Some other iterative strategy may be used to may be used to reorder the resonance frequencies of the resonators.

Figure 8:
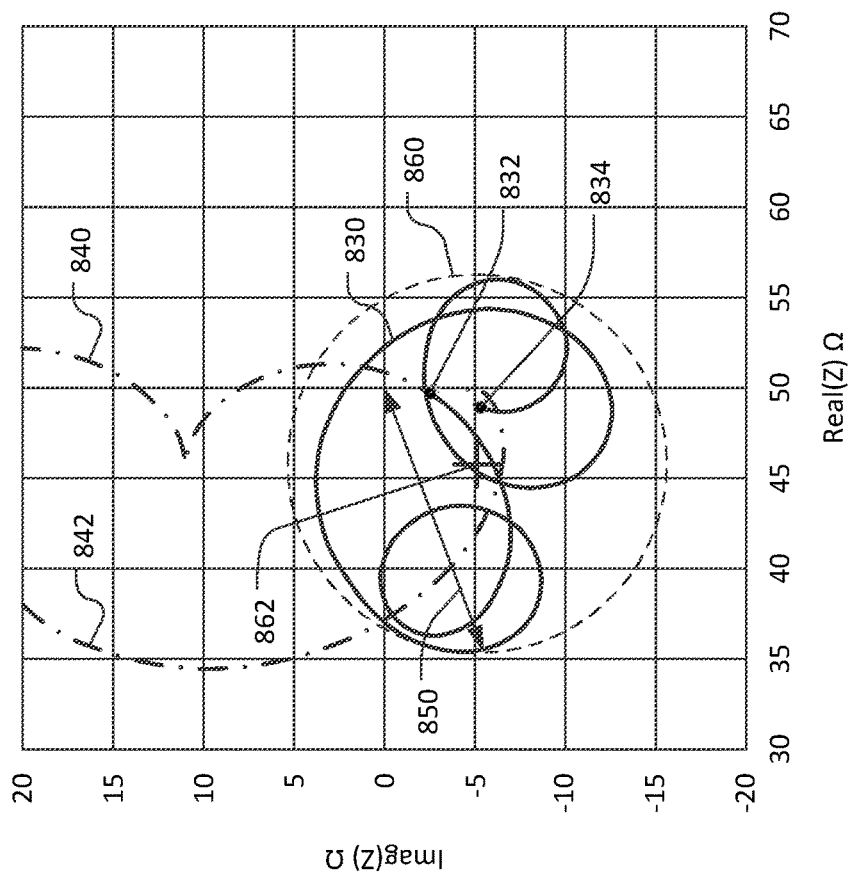
FIG. 8 is a graph of the input impedance of the filter of FIG. 6A.

During iterative optimization of a filter, several different filter performance metrics may be used to determine if a new filter design is an improvement over a previous filter design. FIG. 8 is a graph 800 of the input impedance of the filter 600 from FIG. 6. The graph 800 shows the data from FIG. 6C transformed into the complex impedance plane. The solid line 830 is a plot of the input impedance of an exemplary band-pass filter over its pass band. The ends of the solid line 830, representing the edges of the pass band, are indicated by the small circles 832, 834. The dashed lines 840, 842 are plots of the input impedance of the filter outside of its pass band.

One filter performance metric that may be used to determine if a new filter design is an improvement over a previous filter design is the distance 850 from a nominal impedance value (in this example, a real or resistive impedance of 50 ohms) to the farthest point on the curve 830. The distance 850 is representative of the worst case reflection coefficient of the filter within its pass band when driven by a source having the nominal source impedance. The distance 850 may be the appropriate filter performance metric to determine if a new filter design is an improvement over a previous filter design when the source impedance of the source is fixed at a specific value, such as 50 ohms.

In some applications, the source impedance of the source driving a filter may not fixed at a specific value, but may be tailored to match the filter. In this case, a filter performance metric that may be used to determine if a new filter design is an improvement over a previous filter design is the diameter of the smallest circle 860 that encircles or encloses the curve 830. The diameter of the circle 860 is a measurement of the uniformity of the filter input impedance over the pass band. The circle 860 is usually determined by the two points on the curve 830 having the furthest separation. Since there may be practical limits to the source impedance of the source driving the filter, a combination of the diameter of the circle 860 and the distance 850 may be used as the filter performance metric to determine if a new filter design is an improvement over a previous filter design. For example the filter performance metric may be to reduce the diameter of the circle 860 with the limit that the distance 850 cannot exceed a predetermined value. The center of the circle 860 (indicated by the cross 862) is also a useful measure, as it is the complex conjugate of the source impedance that will provide a good average match to all of the points on curve 830.

Alternative figures of merit can also be used that can approximate this analysis at lower computational cost. The center of circle 860 can be approximately found by computing the mean value on curve 830 and the radius of the circle 860 can be approximated by finding the point on curve 830 that is at the maximum distance on the complex plane from the mean value.

Many applications of SAW band-pass filters must operate over an extended temperature range. For example, a SAW band-pass filter for use in a consumer communications device may be designed for a nominal temperature of 25° C., but have to operate over a temperature range from 0° C. to 55° C. A SAW band-pass filter for use in an industrial or military communications device may be designed for a much larger temperature range. Variations in temperature will cause the resonant frequencies of the SAW resonators to shift proportionally. When this happens, the general shape of a plot of the input impedance of a filter may be unchanged, but the portion of the plot representing the pass band will shift. In the example of FIG. 8, the pass band (solid line 830) will shift along the continuous curve 832-830-834. To ensure that the input impedance at one or the other edge of the pass band does not change substantially at extreme temperatures, it may be preferable to design a filter such that the input impedance at both edges of the pass band is close to the nominal source impedance at nominal temperature. In this case, a filter performance metric that may be used to determine if a new filter design is an improvement over a previous filter design is the distance between the ends 832, 834 of the solid curve 830.

Referring back to FIG. 7, a determination may eventually be made at 735 that no additional alternate filter designs need be tried ("no" at 735). This determination may be made after analysis of all permitted resonant frequency reorderings. The determination that no additional alternate filter designs need be tried may be made after a predetermined number of randomly selected resonant frequency orders are analyzed, or after a predetermined number of iterative cycles through the actions from 725 to 735. The determination that no additional alternate filter designs need be tried may be made when the results of the analysis at 730 indicate that the most recent filter design is "good enough", which is to say the most recent filter design meets some further design criteria in addition to the design criteria met by the baseline design from 715. The further design criteria may be related to, or the same as, the filter performance metric used at 730 to determine whether or not a new filter design is an improvement over a previous filter design. For example, the further design criteria may be or include the distance 850 less than or equal to a first predetermined distance, the diameter of the circle 860 less than or equal to a predetermined diameter, and/or the between the ends 832, 834 of the solid curve 830 less than or equal to a second predetermined distance.

After the determination that no additional alternate filter designs need be tried is made at 735, the best design may be selected at 740. When the determination that no additional alternate filter designs need be tried was made when the last design was "good enough", or when the determination that no additional alternate filter designs need be tried may be made after a predetermined number of iterations, the last design will inherently be the best design. When the determination that no additional alternate filter designs need be tried is made after all of the possible resonant frequency orders are analyzed, the best design may be selected using a measurement such as the distance 850, the diameter of the circle 860, and/or the between the ends 832, 834 of the solid curve 830.

The design selected at 740 may be further optimized at 745, for example, by the design engineer using the circuit design software tool and/or the electromagnetic (EM) analysis tool. A determination may then be made at 750 whether or not the optimized filter from 745 meets the entire set of specifications from 705. When the optimized filter meets the specifications ("yes" at 750) the process 700 may finish at 795. When the optimized filter does not meet the set of specifications ("no" at 750), all or portions of the process 700 may be repeated. For example, the process 700 may return to 710 to select a different filter architecture.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A method of designing a band-pass filter, comprising:
   establishing a baseline filter design meeting first design criteria, the baseline filter design including a plurality of surface acoustic wave resonators, each surface acoustic wave resonator having a respective resonant frequency, the plurality of surface acoustic wave resonators organized by resonant frequency into two or more groups;
   establishing one or more alternative filter designs, each of the one or more alternative filter designs derived from the baseline filter design by reordering the resonant frequencies of two or more of the plurality surface acoustic wave resonators within at least one of the two or more groups;
   calculating a respective performance metric related to an input impedance over a pass band of each of the baseline filter designs and the one or more alternative filter designs; and
   selecting a final filter design from among the baseline filter design and the one or more alternative filter designs based on the respective performance metrics.

2. The method of claim 1, wherein
   the two or more groups include a first group and a second group, and
   establishing one or more alternative filter designs comprises reordering the resonant frequencies of two or more acoustic wave resonators within the first group and/or reordering the resonant frequencies of two or more surface acoustic wave resonators within the second group.

3. The method of claim 2, wherein frequency spans of the resonant frequencies of surface acoustic wave resonators within each of the first group and the second group are both less than or equal to one-half of a frequency difference between average frequencies of the first group and the second group.

4. The method of claim 2, where a frequency difference between average frequencies of the first group and the second group is greater than or equal to one-half of a bandwidth of the band-pass filter.

5. The method of claim 2, wherein
   the two or more groups include a third group, and
   establishing one or more alternative filter designs comprises reordering the resonant frequencies of two or more surface acoustic wave resonators within the third group.

6. The method of claim 1, wherein
   the performance metric is a maximum reflection coefficient over the pass band, and
   selecting the final filter design comprises selecting, from the baseline filter design and the one or more alternative filter designs, a design with the lowest maximum reflection coefficient over the pass band.

7. The method of claim 1, wherein
   the performance metric is a diameter of a minimum-size circle circumscribing the input impedance over the pass band plotted on a complex impedance plane, and selecting the final filter design comprises selecting, from the baseline filter design and the one or more alternative filter designs, a design with the smallest diameter of a minimum-size circle circumscribing the input impedance over the pass band plotted on the complex impedance plane.

8. The method of claim 1, wherein
the performance metric is a distance between input impedances at the edges of the pass band plotted on a complex impedance plane, and
selecting the final filter design comprises selecting, from the baseline filter design and the one or more alternative filter designs, a design with the smallest distance between input impedance at the edges of the pass band plotted on the complex impedance plane.

9. The method of claim 1, wherein establishing alternative filter designs and calculating respective performance metrics are repeated for all permitted reorderings of the resonant frequencies of the plurality of surface acoustic wave resonators.

10. The method of claim 1, wherein establishing and analyzing alternative filter designs are repeated for a predetermined number of randomly-selected permitted reorderings of the resonant frequencies of the plurality of surface acoustic wave resonators.

11. The method of claim 1, wherein establishing and analyzing alternative filter designs further comprises:
starting with the baseline filter design, establishing a new filter design by interchanging the resonant frequencies of two resonators from the same group;
calculating the performance metric for the new filter design;
determining whether or not the performance metric of the new filter design is an improvement over the performance metric of the baseline filter design; and
when the performance metric of the new filter design is an improvement over the performance metric of the baseline filter design, defining the new filter design to be the baseline filter design, or
when the performance metric of the new filter design is not an improvement over the performance metric of the baseline filter design, discarding the new filter design and retaining the baseline filter design.

12. The method of claim 11, further comprising:
determining if the new filter design satisfies second design criteria in addition to the first design criteria; and
when the new filter design satisfies the second design criteria, selecting the new filter design as the final design, or
when the new filter design does not satisfy the second design criteria, repeating the method of claim 10.

13. The method of claim 12, wherein
the performance metric is a maximum reflection coefficient over the pass band, and
the second design criteria is the maximum reflection coefficient over the pass band does not exceed a predetermined value.

14. The method of claim 12, wherein
the performance metric is a diameter of a minimum-size circle circumscribing the input impedance over the pass band plotted on a complex impedance plane, and
the second design criteria is the diameter of the minimum-size circle does not exceed a predetermined value.

15. The method of claim 12, wherein
the performance metric is a distance between input impedance at the edges of the pass band plotted on a complex impedance plane, and
the second design criteria is the distance between the reflection coefficient of the edges of the pass band does not exceed a predetermined value.

16. A filter designed by a method, the method comprising:
establishing a baseline filter design meeting first design criteria, the baseline filter design including a plurality of surface acoustic wave resonators, each surface acoustic wave resonator having a respective resonant frequency, the plurality of surface acoustic wave resonators organized by resonant frequency into two or more groups;
establishing one or more alternative filter designs, each of the one or more alternative filter designs derived from the baseline filter design by reordering the resonant frequencies of two or more of the plurality surface acoustic wave resonators within at least one of the two or more groups;
calculating a respective performance metric related to an input impedance over a pass band of each of the baseline filter design and the one or more alternative filter designs; and
selecting a final filter design from among the baseline filter design and the one or more alternative filter designs based on the respective performance metrics.

* * * * *